US006632593B2

United States Patent
Yamaguchi et al.

(10) Patent No.: US 6,632,593 B2
(45) Date of Patent: Oct. 14, 2003

(54) PATTERN-FORMING METHOD USING PHOTOMASK, AND PATTERN-FORMING APPARATUS

(75) Inventors: Takako Yamaguchi, Atsugi (JP); Ryo Kuroda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/781,331

(22) Filed: Feb. 13, 2001

(65) Prior Publication Data

US 2001/0046719 A1 Nov. 29, 2001

(30) Foreign Application Priority Data

Feb. 15, 2000 (JP) ........................................ 2000-036609
Jan. 25, 2001 (JP) ........................................ 2001-017289

(51) Int. Cl.[7] .............................. G03C 5/00; G03F 9/00
(52) U.S. Cl. ......................................... 430/322; 430/5
(58) Field of Search ................................ 430/311, 312, 430/322, 396; 355/78

(56) References Cited

U.S. PATENT DOCUMENTS

| 4,464,460 A | * | 8/1984 | Hiraoka et al. | 430/323 |
| 4,576,475 A | * | 3/1986 | Kitagawa et al. | 355/132 |
| 4,659,429 A | * | 4/1987 | Isaacson et al. | 430/311 |
| 5,413,884 A | * | 5/1995 | Koch et al. | 430/394 |
| 5,858,621 A | * | 1/1999 | Yu et al. | 430/312 |
| 5,958,632 A | * | 9/1999 | Sekiguchi | 430/5 |
| 6,171,730 B1 | | 1/2001 | Kuroda et al. | 430/5 |
| 6,187,482 B1 | | 2/2001 | Kuroda et al. | 430/5 |
| 2001/0036581 A1 | * | 11/2001 | Inao et al. | 430/5 |

FOREIGN PATENT DOCUMENTS

JP          11-145051          5/1999

* cited by examiner

Primary Examiner—Mark F. Huff
Assistant Examiner—K. Sagar
(74) Attorney, Agent, or Firm—Fitzpatrick, Cella, Harper & Scinto (57) ABSTRACT

A method of forming a pattern by using a photomask having both a minute aperture where a main component of transmitted light is evanescent light and an aperture where a main component of transmitted light is propagating light. The method includes the steps of forming a photoresist having a film thickness at most equal to a width of the minute aperture on a substrate to be processed, exposing the photoresist by incident light for exposure, and adjusting the film thickness of the photoresist and the conditions of the exposure so as to prevent a photoresist pattern made by the propagating light from extending to an adjacent pattern made by the evanescent light.

11 Claims, 11 Drawing Sheets

PATTERN-FORMING METHOD USING PHOTOMASK, AND PATTERN-FORMING APPARATUS

BACKGROUND OF THE INVENTION

Field of the Invention

This invention relates to a method for forming a pattern using a photomask in a fine processing process, and a pattern-forming apparatus.

Recently, as a semiconductor memory has become larger in its capacity and a CPU processor has become faster and more integrated, finer photolithographic techniques have been essentially required. In general, the lower limit of fine processing in a photolithography apparatus is about the wavelength of the light used. The wavelength of light used in a photolithography apparatus has, therefore, become shorter. Now, a near ultraviolet laser is used, allowing us to conduct fine processing to about 0.1 µm.

Although photolithography has become finer, there are many problems to be solved such as a further shorter wavelength of the laser and development of a lens for such a shorter wavelength band, for fine processing of 0.1 µm or less.

On the other hand, there has been proposed an apparatus for fine processing utilizing a configuration of a nearfield optical microscope (hereinafter, referred to as an "SNOM") for achieving fine processing of 0.1 µm or less with light. It is a technique in which a photoresist is subjected to a local exposure over a light wavelength limit using evanescent light leaking out from a fine aperture of 0.1 µm or less.

However, in any lithography apparatus with an SNOM configuration, fine processing is conducted like pen writing, using a single processing probe or several processing probes, so that throughput may not be improved much.

To solve the above-described problem, there has been suggested a technique that a photomask having a pattern in which evanescent light leaks out between shielding films is tightly placed on a photoresist on a substrate and is subjected to exposure, whereby a fine pattern on the photomask is transferred to the photoresist at one time (Japanese Patent Application Laid-Open No. 11-145051).

A pattern required in actual lithography is a combination of patterns with various sizes. For example, it is often a combination of patterns larger than an exposure wavelength with small patterns formed by evanescent-light exposure.

Thus, when attempting exposure using a mask where apertures with sizes for both evanescent-light exposure and propagating-light exposure are provided on a single matrix, a sensitivity level of the photoresist is dispersed depending on a pattern, so that it is difficult to form a uniform pattern because the light intensity of the evanescent light is much weaker than that of the propagating light.

Figure 9A:
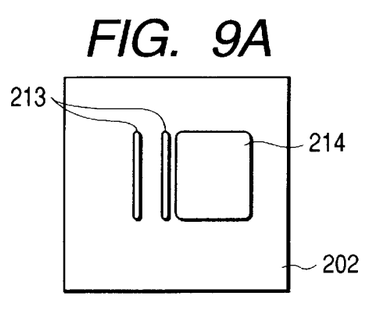
FIGS. 9A, 9B and 9C are schematic views for showing a mask pattern and photoresist patterns formed by different exposure quantities, respectively.

The phenomenon will be detailed with reference to FIGS. 9A to 9C. FIG. 9A shows a mask in which an aperture 213 is disposed near an aperture 214. In this case, the photoresist is a positive type, and when a negative type photoresist is used, the same result is obtained.

The aperture 213 through which the evanescent light is transmitted as a main exposure component gives a considerably smaller quantity of transmitted light than that of incident light, depending on its width, shape and its spatial relationship with other patterns.

Figure 9B:
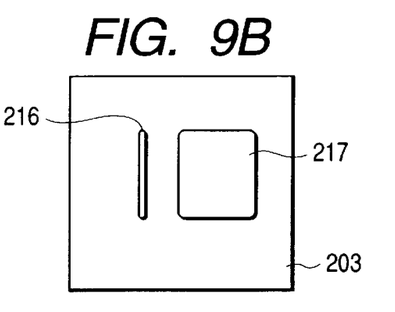

When the above-described mask is used for exposure while controlling a quantity of the incident light to the mask such that the photoresist reacts by a quantity of the evanescent light, the quantity of light from the aperture 214 is so excessive that a photoresist pattern 217 by exposure from the aperture may become larger than the mask pattern and may cover a portion of a photoresist pattern by the exposure from the minute aperture as shown in FIG. 9B.

Figure 9C:
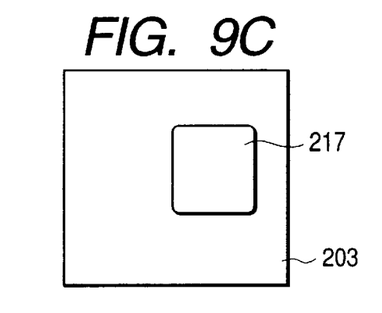

On the other hand, the above-described mask is used for exposure while controlling a quantity of the incident light to the mask such that the photoresist reacts by a quantity of the propagating light from the aperture 214, and the quantity of the evanescent light from the aperture 213 is so small that the photoresist may inadequately react, whereby a photoresist reaction portion by the evanescent light may not be formed, as shown in FIG. 9C.

Figure 3A:
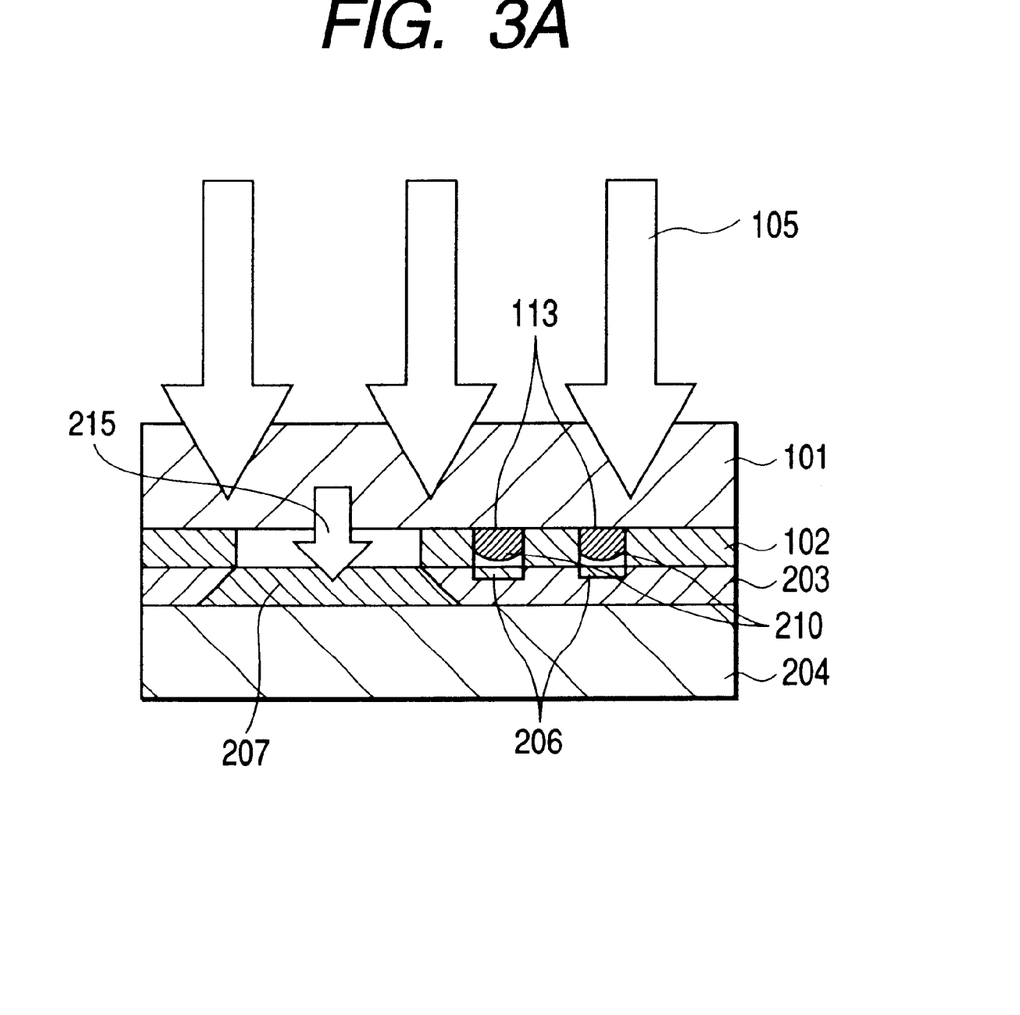
FIGS. 3A and 3B are schematic views for showing an exposure state in the case of a thick photoresist in a conventional example.
Figure 3B:
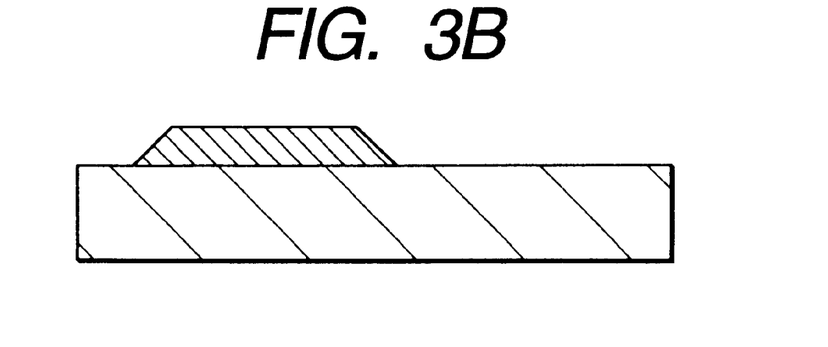

Similarly, when a photoresist is made thicker, its reaction state may become uneven in a photoresist reaction portion 206 by the evanescent light and in a photoresist reaction portion 207 by the propagating light, along the depth direction of a photoresist 203 and along the plane direction of a substrate 204, as shown in FIG. 3A. As a result, only the photoresist reaction portion 207 by the propagating light is formed by development after exposure, as shown in FIG. 3B. Furthermore, the photoresist reaction portion 207 by the propagating light may expand on the substrate 204.

In such a case, patterns may be formed by separate processes; a fine pattern is formed by exposure to evanescent light and then a larger pattern is formed by exposure to usual propagating light. However, it may lead to a higher cost and a lower throughput due to an increase in the numbers of masks and of process steps.

SUMMARY OF THE INVENTION

In light of the above-described problems, an object of this invention is to provide a method for forming patterns by using a photomask capable of forming uniform large and small patterns, and an apparatus for forming such patterns.

The above-described object can be attained by a method for forming a fine pattern using a photomask having a combination of a minute aperture where the main component of transmitted light is evanescent light and an aperture where the main component of transmitted light is propagating light, comprising the steps of: forming a photoresist with a film thickness of a width or less of the minute aperture on a substrate to be processed; and exposing the photoresist by irradiating it with light for exposure.

The object of this invention can also be achieved by an apparatus for forming patterns on a substrate to be processed, the apparatus comprising:

a sample stand for placing the substrate to be processed having a photoresist with a thickness of an exposure wavelength or less formed thereon;

a stage for placing a photomask having a shielding film formed on a photomask substrate, the shielding film having the combination of an aperture having the first width where the main component of light transmitted through the aperture is evanescent light and another aperture having the second width where the main component of light transmitted through the other aperture is propagating light;

a light source for exposure which generates light for exposure; and means for controlling a distance between the substrate to be processed and the photomask.

These details will be later described in Examples.

DESCRIPTION OF THE PREFERRED EMBODIMENTS

Embodiments of this invention will be described in detail with reference to the drawings.

Figure 1:
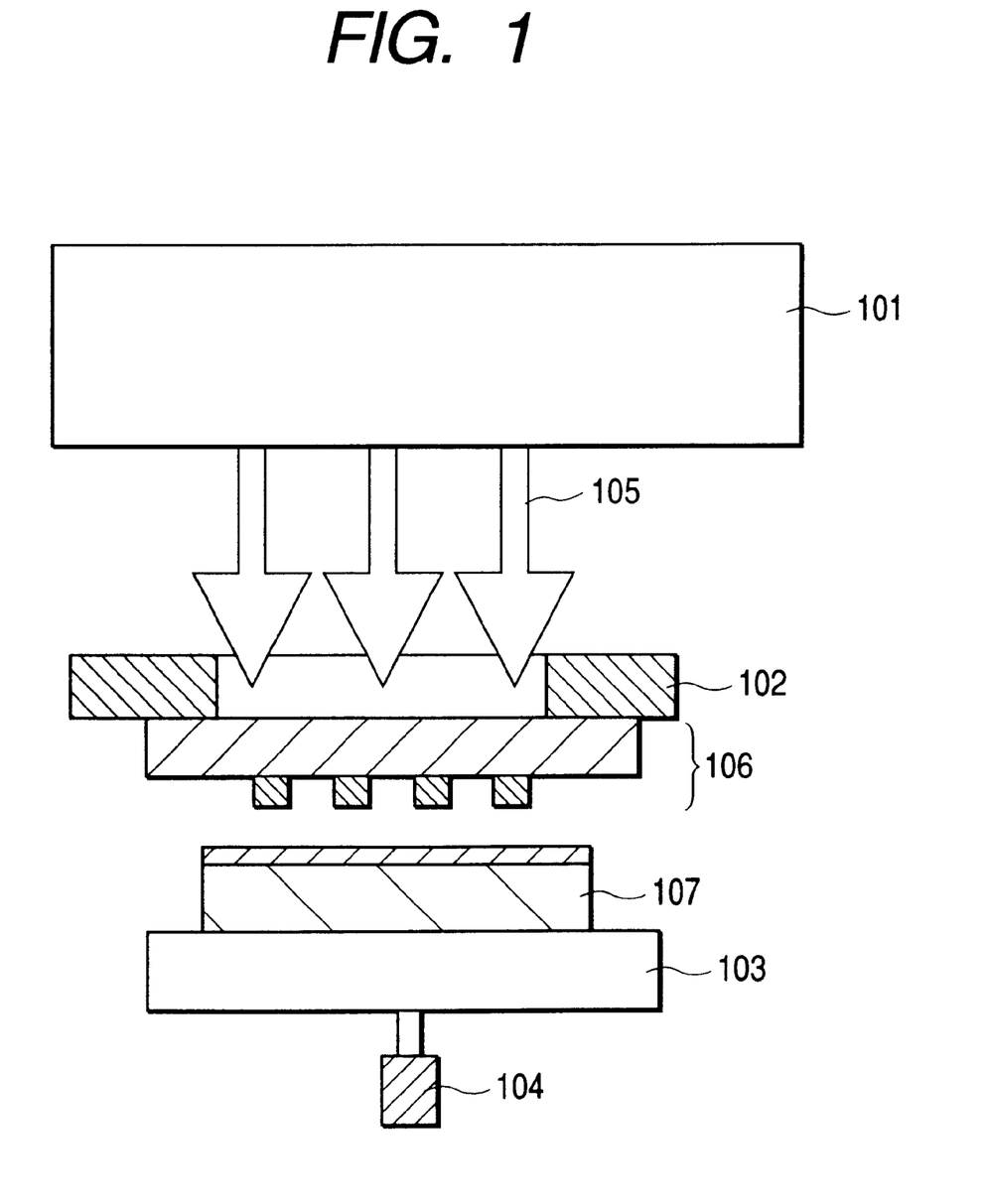
FIG. 1 is a schematic view for showing an apparatus for forming patterns according to this invention.

FIG. 1 shows an apparatus for forming patterns according to this invention. In FIG. 1, numeral 103 indicates a sample stand for placing a substrate (sample) 107 to be processed, numeral 102 indicates a stage for placing a mask 106 for exposure, and numeral 101 indicates a light source 105 for exposure. Light for exposure is, of course, adjusted to cover over the whole exposure region, and, more suitably, may be adjusted to enter perpendicularly to a film for improving energy efficiency. In FIG. 1, numeral 104 indicates distance-controlling means for controlling a distance between the photoresist and the photomask 106.

A pattern-forming method using a photomask in this invention will be described with reference to FIGS. 2A to 2D.

A photomask 106 has a transfer pattern of a shielding film 202 which shields light for exposure, in one side of a glass substrate 201 through which light for exposure is transmitted. The transfer pattern has both a minute aperture 213 having a size such that evanescent light leaks out therethrough as light for exposure and an aperture 214 having a size such that propagating light is transmitted therethrough. The minute apertures 213 and the aperture 214 do not necessarily have the same width, respectively.

The minute aperture 213 having a size such that evanescent light leaks out therethrough has a width shorter than a wavelength of light for exposure. There are no restrictions in length to a minute aperture pattern in the longitudinal direction, and the pattern may be freely selected. The aperture having a size such that the propagating light may be transmitted therethrough has a width longer than the wavelength of light for exposure.

A material for the shielding film is preferably a metal such as Au and Al because it does not transmit light for exposure and it may be readily processed to give a fine pattern. Chemically stable Cr is more preferably because it is hard enough to be resistant to scratches and because, when a photomask is pushed against a photoresist, residue adhering to the photomask can be washed out with a washing liquid containing an oxidizing agent.

The shielding film has a thickness adequate to prevent the transmitted light through the shielding film from exposing the photoresist. Effective pattern formation can be achieved when a thickness L of the shielding film meets the following equation:

$$L > \ln A \cdot \lambda / 2\pi k (A = P \cdot t / E_{th}) \quad (1)$$

wherein K is an extinction coefficient of a material used for the shielding film, Eth is a photoresist sensitivity, $\lambda$ is an exposure wavelength, t is an exposure time, P is an exposure quantity and ln represents a natural logarithm. The thickness is, however, preferably the minimum value meeting equation (1) because a thinner film can facilitate pattern formation and improve dimensional accuracy.

A pattern-forming method using a shielding film on a photomask may be conducted according to a conventional process employing layer processing, EB (Electron Beam) or X-rays. A method generally and frequently used for forming patterns on a photomask is an EB drawing process. Alternatively, the pattern formation can be conducted by using an SPM (Standing Probe Microscope).

In processing using, for example, an AFM (Atomic Force Microscope), among SPMs, an aperture may be formed on a photomask by scanning a cantilever while the cantilever is pushed against the surface of the shielding film on the photomask to shave the surface. Patterns with various aperture widths may be formed by varying pressure applied to the surface, a scanning direction and a shape of the tip of the cantilever used.

Further, it is necessary that a thickness of the photoresist formed on the substrate to be processed is not larger than the width of a minute aperture where the main component of transmitted light is evanescent light, in the light of a difference in intensity between the evanescent light and the propagating light. The reason will be described in detail.

In a minute aperture where the main component of transmitted light is evanescent light, the quantity of that transmitted light is considerably smaller than that of the incident light although it depends on the shape of the minute aperture. Thus, it is difficult to adjust a light-quantity ratio between the evanescent light and the propagating light when conducting exposure using both lights at the same time. When a film thickness is equal to or less than the width of the minute aperture, however, this prevents the propagating light from eroding a pattern formed with the evanescent light as shown in FIG. 9B because a pattern formed by the propagating light does not expand in the film plane direction over a distance corresponding to the film thickness of the photoresist. Thus, a film thickness of the photoresist equal to or less than the width of the minute aperture can prevent a pattern from extending to an adjacent pattern.

Figure 4A:
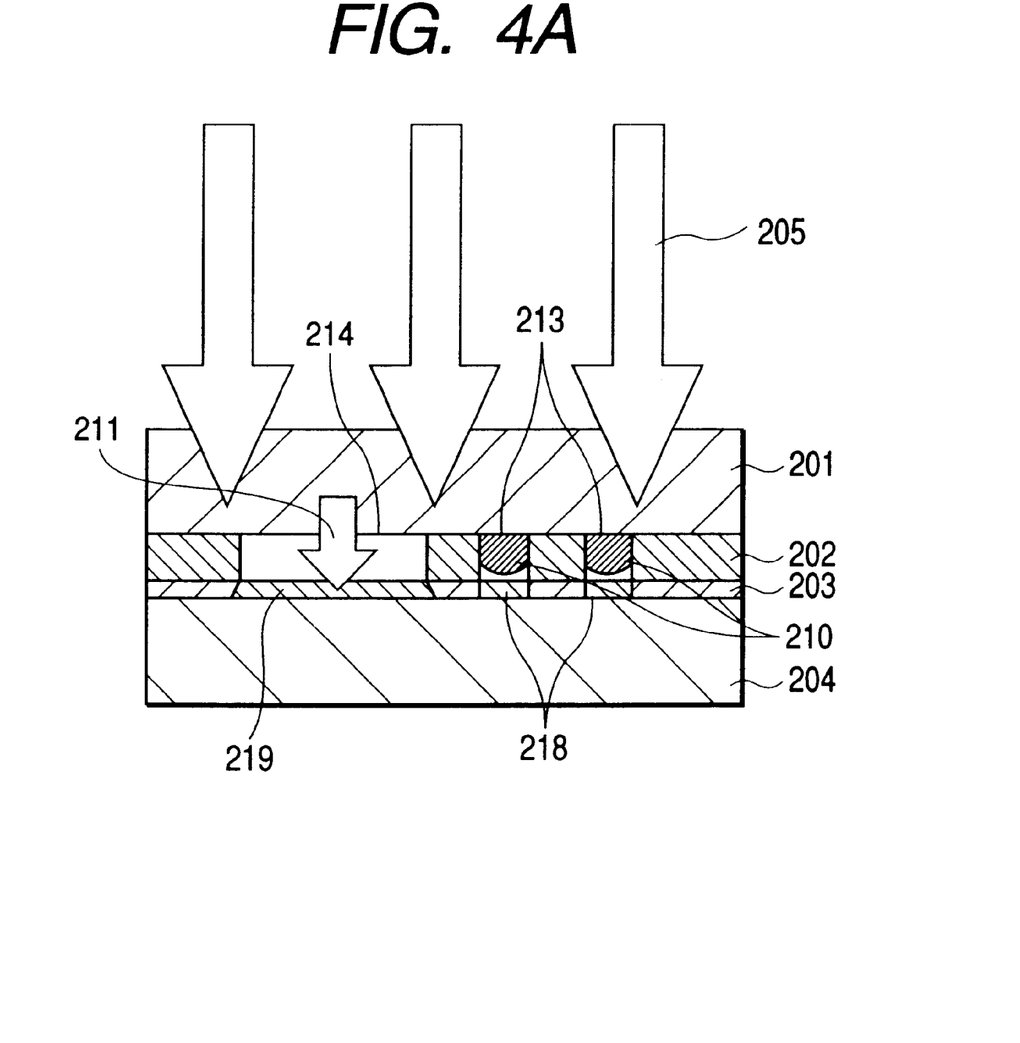
FIGS. 4A and 4B are schematic views for showing an exposure state and a pattern after exposure according to this invention.
Figure 4B:
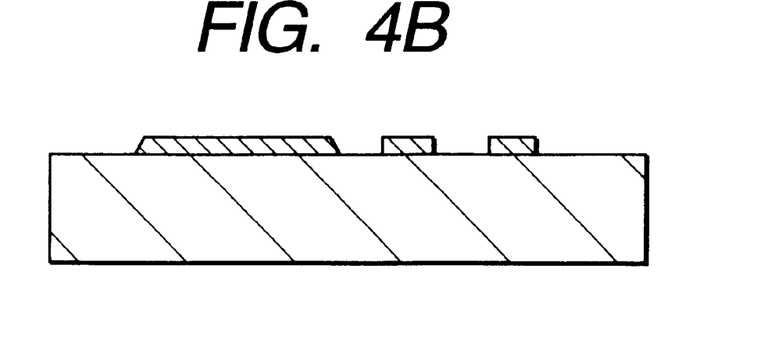

Thus, a photoresist with a thickness equal to or less than the width of the minute aperture may be used to minimize extension of a photoresist reaction portion 219 on a substrate 204 by the propagating light as shown in FIG. 4A and may allow a photoresist reaction portion 218 by the evanescent light to reach the substrate 204 so that the transfer pattern on the photomask can be exactly formed on the substrate 204 even when there are apertures with various sizes on the photomask (FIG. 4B).

The evanescent light has a light quantity less than that of the propagating light, but its pattern may extend, although by only a small amount, along a film plane direction. Therefore, it is similarly effective to adjust a thickness of the photoresist to be a value equal to or less than the width of the smallest pattern formed on the substrate to be actually processed in the light of such an extension.

The evanescent light 210 has a light quantity considerably smaller than that of the incident light for exposure 205 to the photomask, i.e., the ratio of the former to the latter is about $1 \times 10^{-7}:1$, although it depends on the shape of the minute aperture. For exposure of the photoresist reaching the substrate by the evanescent light, it is preferable that the thickness of the photoresist is 100 nm or less and the film thickness ranges $0 < h \leq 100$, where h (nm) is a film thickness.

Correction of a mask pattern will be described.

When a size difference between a pattern after development and an aperture 214 on the photomask due to an extension of the photoresist reaction portion 219 on the substrate 204 is significant in exposure by the propagating light, the width of the aperture may be adjusted to be smaller than a designed dimension.

Specifically, it is preferable to adjust the size of the aperture when a precision error required for a distance between an aperture 214 and a minute aperture 213 or a pattern size after exposure by an aperture 214 is 1 $\mu$m or less, although it may depend on a photoresist or process used.

In a process conducted after pattern formation described above, it is preferable to form a buffer layer between the substrate and the photoresist when an aspect ratio in a pattern formed on the substrate is too small to satisfactorily conduct a process such as etching and deposition. For example, there may be formed a multilayer structure comprising a dry-etching resistant layer, an oxygen-RIE (Reactive Ion Etching) resistant layer and a thin photoresist layer for image formation in sequence from the side of the substrate, and then a pattern formed in the thin photoresist layer for image formation is transferred to another thick layer to form a pattern with a higher aspect ratio.

A material for the photoresist 203 may be selected from those used in a usual semiconductor process. A light wavelength for exposing these materials ranges within about 200 to 500 nm. In particular, a photoresist corresponding to a g-ray or an i-ray within a range of 350 to 450 nm may be selected to improve process flexibility and to reduce cost because of its diversity and relatively lower cost.

It is preferable to apply an antireflection film on the substrate when a pattern shape formed along a direction perpendicular to the substrate is distorted due to mutual interference between light for exposure reflected on the substrate and light for exposure entering the substrate.

When there is formed a buffer layer between the photoresist and the substrate to be processed, it is preferable that the buffer layer be made of a material exhibiting a lower transmittance to light for exposure in order to prevent pattern extension due to going around of light for exposure from the lower layer of the photoresist.

The light used for the exposure must have a wavelength such that the photoresist 203 used can be exposed. For example, when the above photoresist corresponding to the g-ray or i-ray is selected as the photoresist 203, exposure may be conducted using a HeCd laser (light wavelength: 325 nm, 442 nm), a GaN blue semiconductor laser (410 nm), a second harmonic generation (SHG) laser or third harmonic generation (THG) laser in an IR laser or a mercury lamp (g-ray: 436 nm, i-ray: 365 nm).

A process for forming patterns according to this invention will be described with reference to FIGS. 2A to 2D.

The photoresist 203 is applied on the surface of the substrate 204 to a thickness of 100 nm or less. It is preferably as thin as possible; specifically, $0 < h \leq 100$, where h is a film thickness (nm).

Figure 2A:
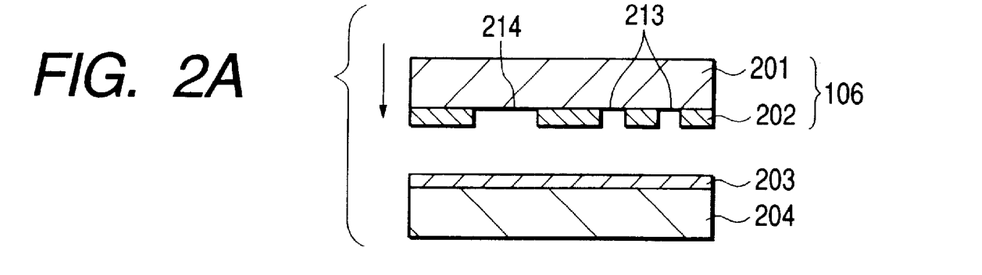
FIGS. 2A, 2B, 2C and 2D are schematic views for showing a method for forming patterns according to this invention.
Figure 2B:
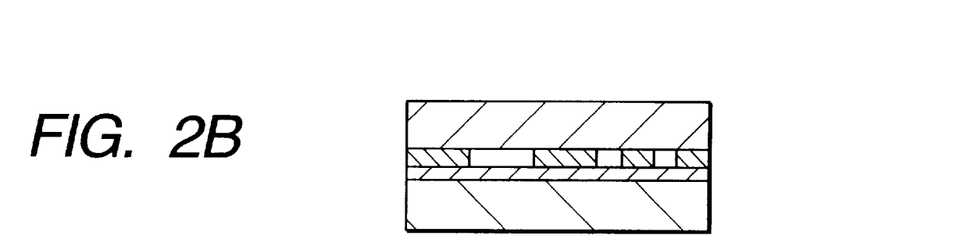

Then, as shown in FIG. 2A, the photoresist 203 is made close to the side of the photomask made of a glass substrate 201 on which a shielding film 202 is formed until the shielding film 202 evenly contacts with the photoresist 203 (FIG. 2B).

Contacting the shielding film on the photomask with the photoresist may be conducted by fixing one of the photomask and the photoresist and then making the other not fixed close to the fixed one by using, for example, a micrometer; by applying pressure to the other not fixed to the one by utilizing a solid, liquid or gas; or by vacuuming the space between both by using, for example, a vacuum pump.

When an elastic film mask is used, the space between the mask and the photoresist can be vacuumed to bend the mask so that the whole surface of the mask may be closely in contact with the surface of the photoresist.

Figure 2C:
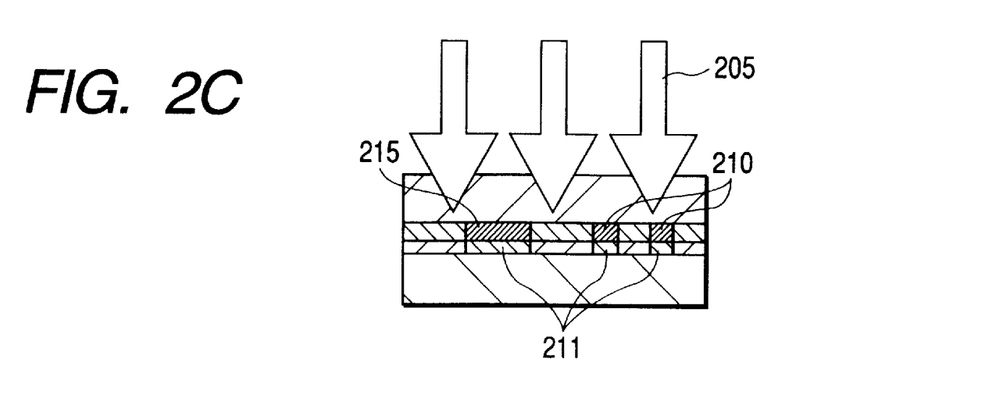

As shown in FIG. 2C, the photoresist 203 is exposed by irradiation of light 205 for exposure from the side having no shielding film 202 of the glass substrate 201.

The photoresist may be a positive or negative type one. FIGS. 2A to 2D show a state of using a negative type photoresist.

Figure 2D:
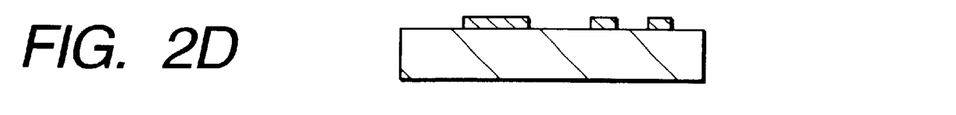

The negative type photoresist 203 under the portion having no shielding film 202 on the photomask becomes development-resistant as a photoresist reaction portion 211. Removing the photomask and then development can provide a pattern consisting of photoresists with various widths reflecting the pattern of the shielding film 202 on the photomask, on the substrate 204 (FIG. 2D).

After exposure by the propagating light and the evanescent light as described above, the substrate 204 may be processed as usual. For example, after developing the photoresist, etching is conducted, on the substrate 204, to form a pattern corresponding to the pattern formed in the photoresist on the substrate.

Figure 5:
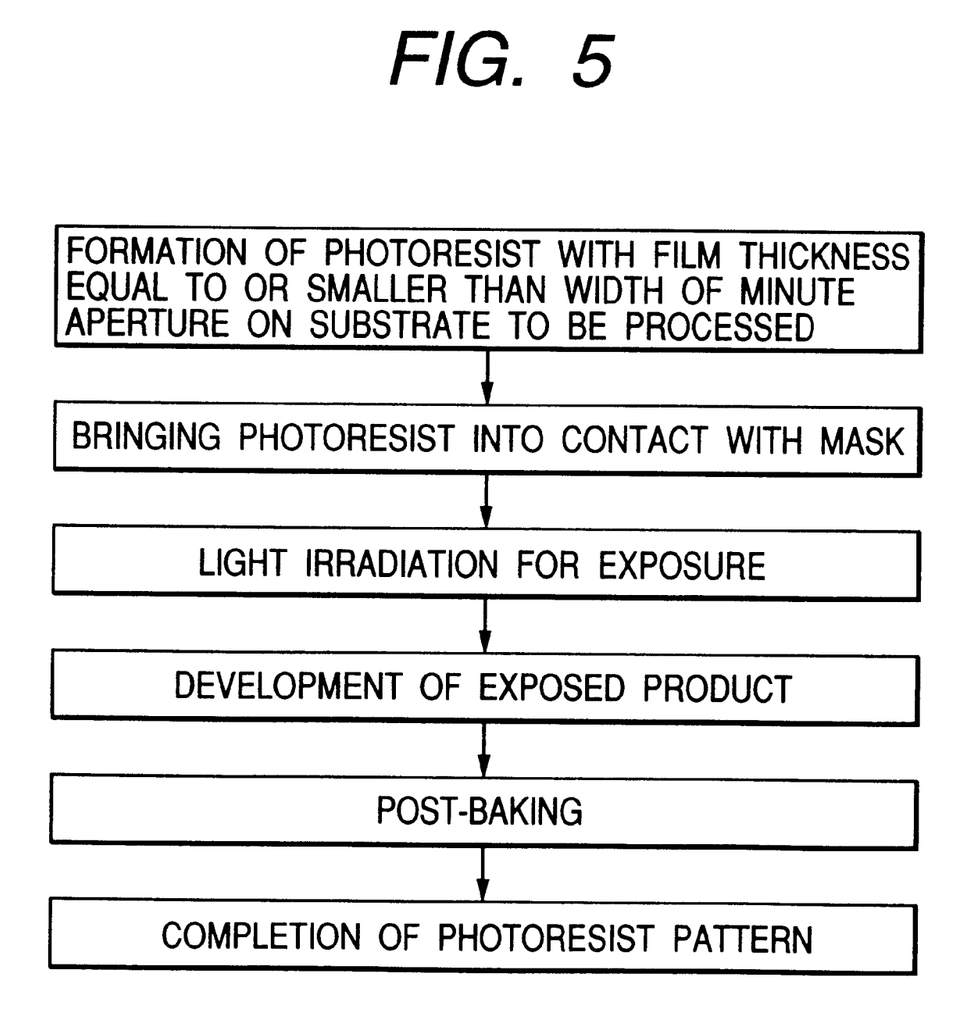
FIG. 5 is a flow chart of a process for forming patterns according to this invention.

FIG. 5 shows a flow chart of the formation process.

As described above, the method of this invention can provide uniform patterns with various sizes from a minute pattern smaller than a diffraction limit of light to a pattern which can be formed by usual photolithography, by using one sheet of photomask, thereby resulting in improvement of throughput in a photolithography step.

This invention will be more specifically described with reference to Examples. These examples are the most preferred embodiments of this invention, but do not limit this invention at all.

(Example 1)

FIGS. 6A to 6E show a method for forming a pattern according to this example.

Figure 6A:
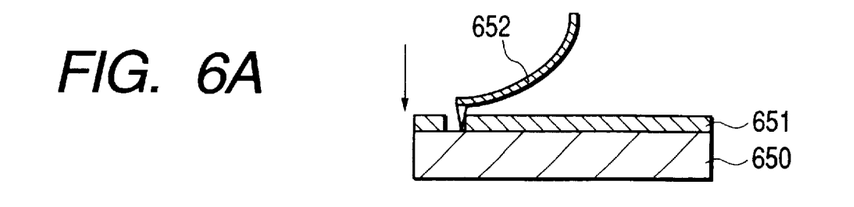
FIGS. 6A, 6B, 6C, 6D and 6E are schematic views for showing a photomask and a method for forming patterns in Example 1 according to this invention.
Figure 6B:
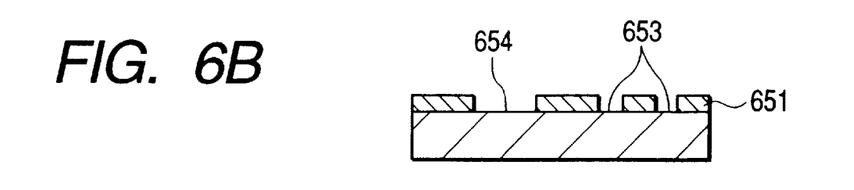

On a glass plate 640 as a photomask substrate, an Al thin film 651 is formed to a thickness of 36 nm as a shielding film by sputtering. As shown in FIG. 6A, while pushing the needle tip of a cantilever 652 for AFM with an elastic constant of 45 N/m against the thin film at a pressure of about 1 ×10⁻⁵N, the Al thin film 651 is scanned with the cantilever to form a minute aperture 653 with an opening width of about 100 nm (FIG. 6B). The cantilever 652 AFM is moved several times while pushing its needle tip against a Ti film to blunt the needle tip. Then, while pushing the blunted needle tip against the Al thin film 651 at a pressure of about 5 ×10⁻⁵N, the Al thin film 651 is scanned with the cantilever as described above to form an aperture 654 with an opening width of 1 $\mu$m.

An antireflection film is formed on an Si substrate 601, and then a positive type photoresist 602 corresponding to a g-ray is formed thereon to a thickness of 100 nm by using a spin coater. Then, the photoresist 602 is pre-baked.

Figure 6C:
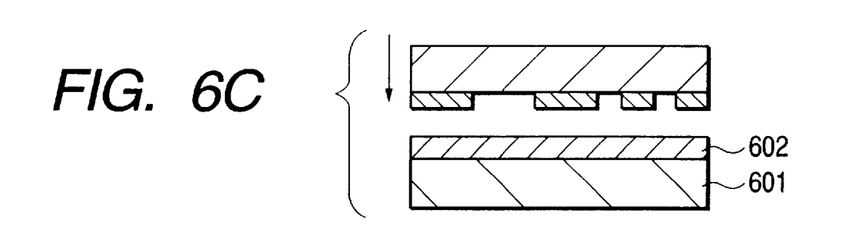
Figure 6D:
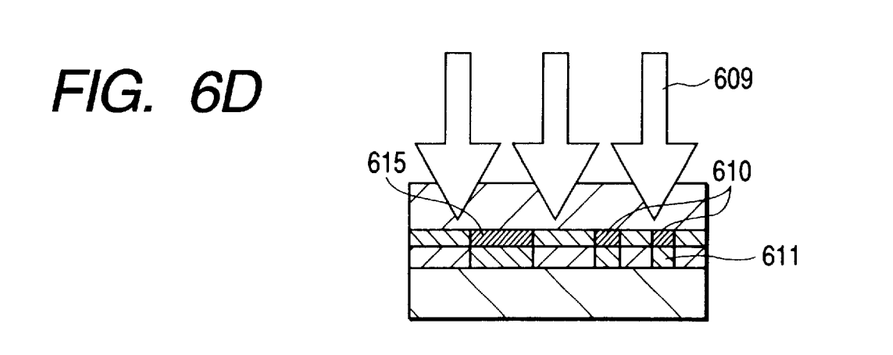

The positive type photoresist 602 may be exposed using a mask aligner (Model MA-10, manufactured by Mikasa Company). First, as shown in FIG. 6C, the Al thin film 651 is moved toward the positive type photoresist 602. After contacting the Al thin film 651 with the positive type photoresist 602, the positive type photoresist 602 is irradiated with light 609 (10 mW) for exposure from a mercury lamp for 3 seconds to expose the photoresist with the evanescent light 610 leaking from the minute aperture 653 and the propagating light 615 through the aperture 654, thereby forming a photoresist reaction portion 611 which can be dissolved in a developing solution within the positive type photoresist 602 (FIG. 6D). After exposure, the Al thin film 651 is removed from the positive type photoresist 602. Then, the positive type photoresist 602 is developed and post-baked.

Figure 6E:
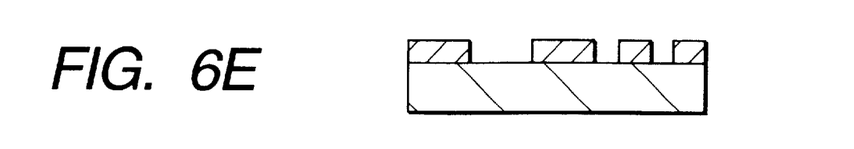

Thus, both the fine pattern of 100 nm and the pattern of 1 $\mu$m are transferred on the Si substrate 601 by a single exposure (FIG. 6E).

(Example 2)

Figure 7A:
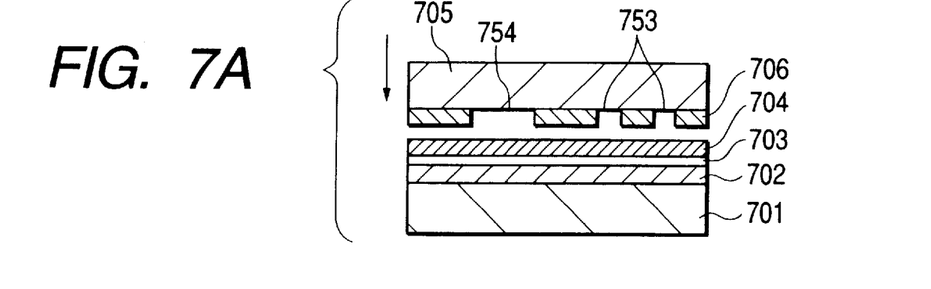
FIGS. 7A, 7B, 7C, 7D and 7E are schematic views for showing a method for forming patterns by using two buffer layers in Example 2 according to this invention.

FIGS. 7A to 7E show a method for forming a pattern in this example using two buffer layers and a photoresist layer. FIG. 7A shows a photomask and an object to be exposed. A Cr thin film is vapor-deposited to a thickness of 60 nm on one side of a glass substrate 705. Then, to process this Cr thin film by using an EB (Electron Beam) drawing apparatus, a photomask having a shielding film 706 as a pattern to be transferred is formed. Here, on the photomask, there are both the minute aperture 753 having a size where the evanescent light leaks as the main component of transmitted light and the aperture 754 through which the propagating light is transmitted.

On an Si substrate 701 on which a shielding film has been approached, a positive type photoresist is formed to a thickness of 500 nm by using a spin coater, and then the photoresist is heated at 200° C. for 30 minutes to form the first layer 702. On the first layer 702, an organic solvent solution of SOG (Spin On Glass) is formed and the solution is heated to form an oxidized Si film with a thickness of 100 nm as the second layer 703. On the second layer 703, a negative type photoresist is formed to a thickness of 50 nm for forming an image for the third layer 704 and it is then pre-baked at 110° C. for 10 minutes.

Figure 7B:
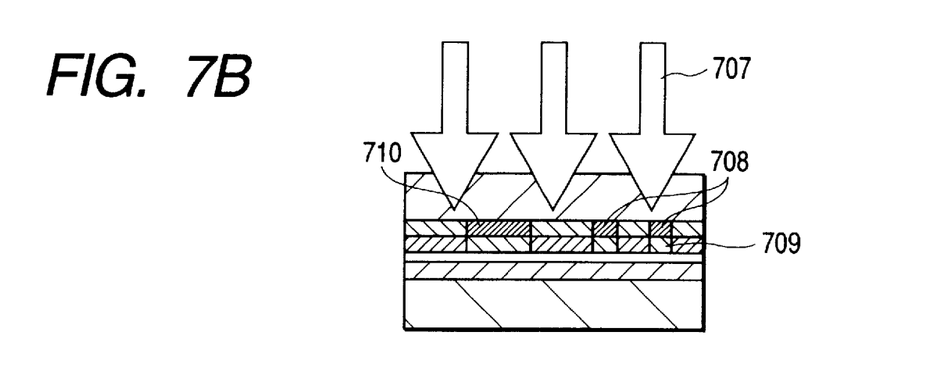

The Si substrate 701 is placed on a sample stand in a mask aligner and the sample stand is moved toward the photomask by using a micrometer. After bringing the photoresist as the third layer 704 into contact with the shielding film 706 of the Cr thin film on the photomask, the third layer 704 is exposed by the evanescent light 708 and the propagating light 710 from light 707 for exposure to transfer the pattern of the shielding film 706 to the third layer 704 as a photoresist reaction portion 709 (FIG. 7B).

Figure 7C:
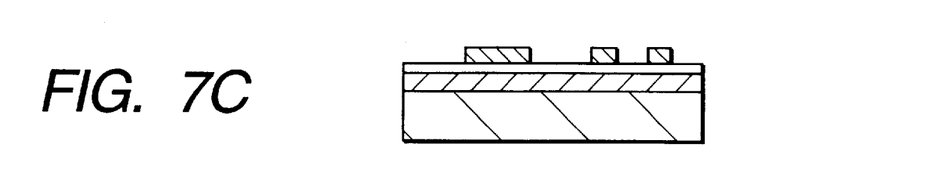
Figure 7D:
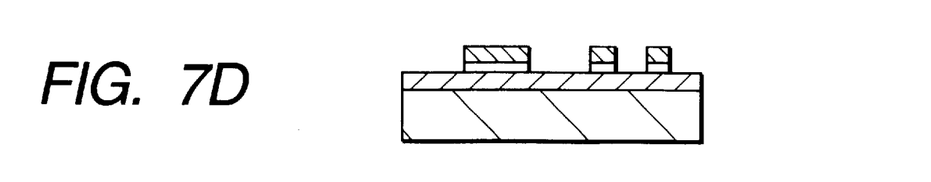
Figure 7E:
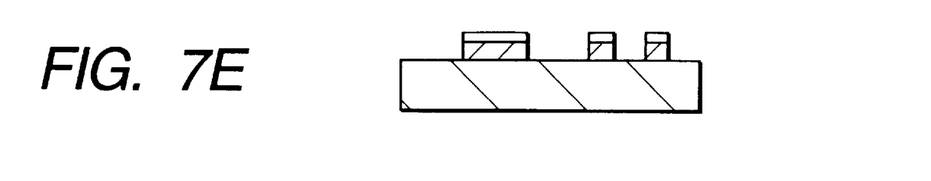

The photomask is removed from the photoresist of the third layer 704. Then, the photoresist of the third layer 704 is developed and post-baked. Thus, the pattern to be transferred on the photomask is transferred to the third layer 704 (FIG. 7C). Then, the second layer 703 is patterned by dry etching using the pattern transferred to the third layer 704 as a mask (FIG. 7D). By using the pattern in the second layer 703 thus formed as a mask, the first layer 702 is processed with oxygen RIE (FIG. 7E).

Thus, the patterns with various sizes to be transferred are transferred on the Si substrate 701 with higher contrast. Since an aspect ratio of the photoresist on the Si substrate 701 is high, a pattern by which a subsequent device process can be readily conducted can be formed.

(Example 3)

Figure 8A:
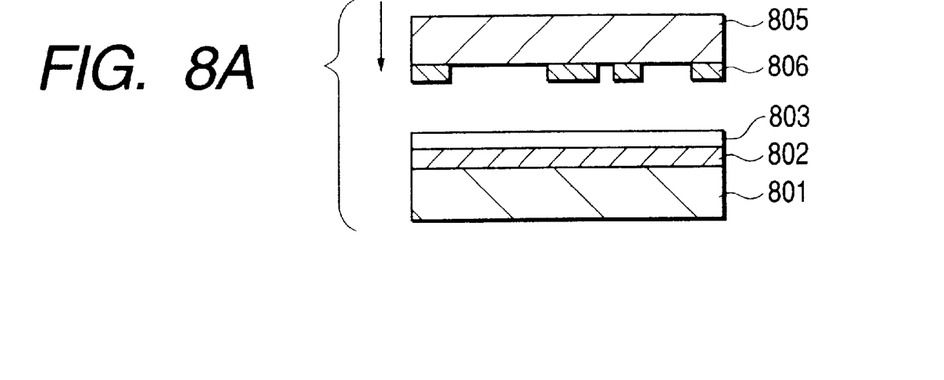
FIGS. 8A, 8B, 8C and 8D are schematic views for showing a method for forming patterns by using one buffer layer in Example 3 according to this invention.

FIGS. 8A to 8D show a method for forming a pattern in this example by using one buffer layer and a photoresist layer. FIG. 8A shows a photomask and an object to be exposed. On one side of a glass substrate 805, a Cr thin film is vapor-deposited to a thickness of 80 nm. And, to process this Cr thin film by using an EB (Electron Beam) drawing apparatus, a photomask having a shielding film 806 as a pattern to be transferred is formed. Here, on the photomask, there are various sizes of apertures, i.e., those with a size where the evanescent light leaks as the main component of transmitted light and those through which the propagating light is transmitted.

On an Si substrate 801 on which a shielding film has been formed, a positive type photoresist is formed to a thickness of 400 nm by using a spin coater, and then the photoresist is heated at 200° C. for 30 minutes to form the first layer 802. On the first layer 802, an Si containing negative type photoresist is formed to a thickness of 80 nm and the layer is pre-baked to form the second layer 803.

The Si substrate 801 on which the two-layer photoresist has been applied is moved toward the shielding film 806 on the photomask and finally, the second layer 803 is contacted with the shielding film 806 of the Cr thin film on the photomask.

Figure 8B:
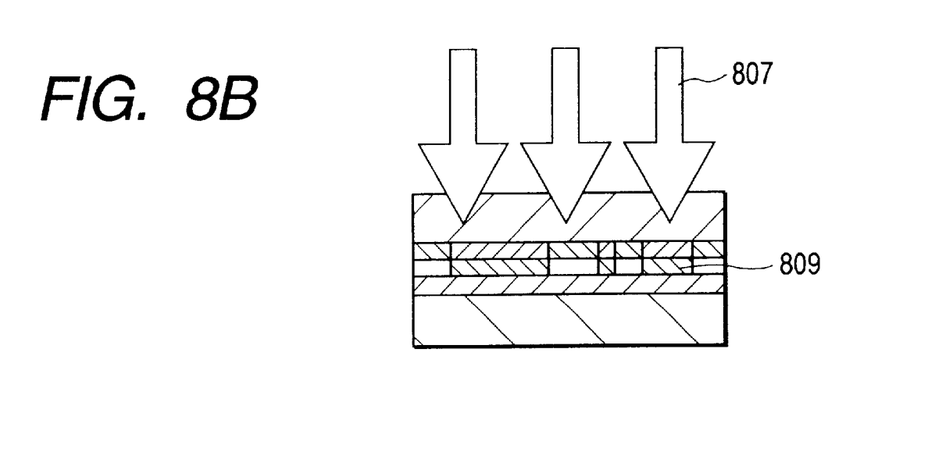
Figure 8C:
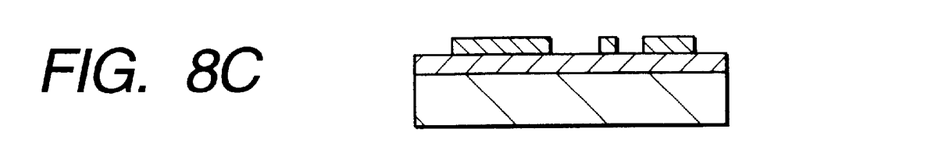

Then, the second layer 803 is exposed by the evanescent light and the propagating light from light 807 for exposure to transfer the pattern of the shielding film 806 to the second layer 803 as a photoresist reaction portion 809 (FIG. 8B). The photomask is removed from the photoresist. Then, the photoresist is developed and post-baked. Thus, the pattern to be transferred and the photomask is transferred to the second layer 803 (FIG. 8C).

Figure 8D:
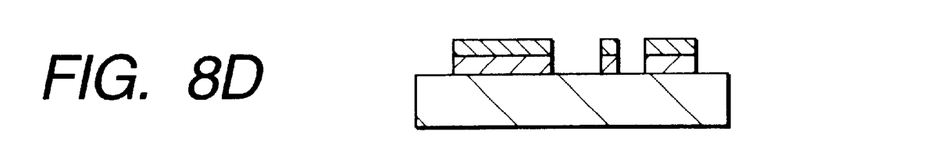

While using the pattern transferred to the second layer as a mask, the first layer is processed with oxygen RIE (FIG. 8D). By using oxygen RIE in processing, Si-contained in the second layer is oxidized to improve oxygen-RIE sensitivity.

Thus, the original patterns to be transferred having various sizes on the photomask are transferred onto the substrate 801 with a higher contrast by a single exposure. Throughput is improved because of reduction of the number of photoresist formations to two and the number of pattern transfers.

(Example 4)

There will be described a case in which an aperture is very close to a minute aperture or in which an acceptable precision error is 1 $\mu$m or less for a pattern after exposure.

Figure 10A:
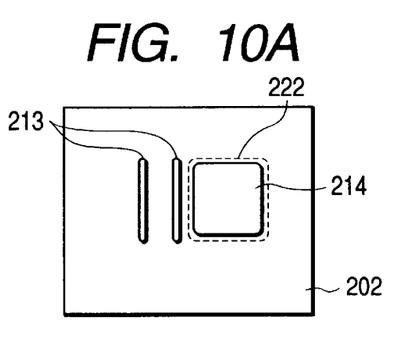
FIGS. 10A and 10B are schematic views for showing a difference between a mask pattern and a photoresist pattern after exposure.
Figure 10B:
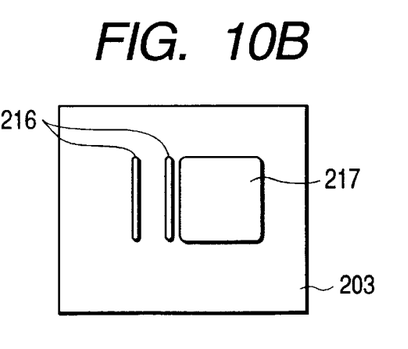

FIG. 10A shows a mask pattern while FIG. 10B shows a photoresist pattern formed by developing a photoresist after exposure using the mask shown in FIG. 10A. In FIG. 10A, the contour 222 of a pattern with a desired size is indicated by a dotted line.

Since a light quantity from a minute aperture 213 with a pattern width of 100 nm is considerably lower than a light quantity from an aperture 214, exposure adjusted for the minute aperture 213 may make a photoresist pattern 217 by exposure from the aperture 214 larger than the aperture 214.

A positive type Si-containing photoresist is patterned using a mask aligner. In this case, a minute aperture pattern for a mask pattern width of 100 nm as an exposure pattern cannot be formed in the photoresist under the conditions of an exposure time of 30 seconds and a development time of 5 seconds. When the exposure time was 100 seconds, a photoresist pattern 216 by exposure from the minute aperture 213 could be formed.

Meanwhile, the photoresist pattern 217 by exposure from the aperture 214 was expanded by about 10% when an exposure time was increased. Thus, exposure was conducted to an aperture pattern with a size smaller than the desired pattern size 222 by 10% so that desired photoresist patterns with various sizes could be formed.

(Example 5)

Figure 11A:
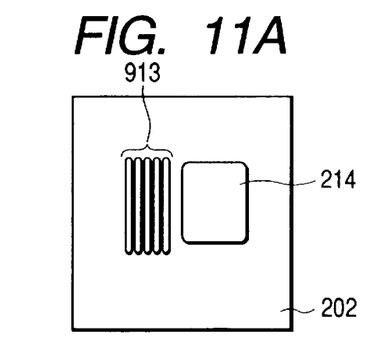
FIGS. 11A and 11B are schematic views for showing a mask pattern where minute apertures are periodically aligned in Example 5 and a photoresist pattern according to this invention.

In this example, there will be described a pattern where minute apertures are periodically aligned. FIG. 11A shows a mask having both periodically aligned minute apertures 913 through which the evanescent light leaks and an aperture 214 through which the propagating light is transmitted.

In such a structure where the minute apertures are periodically aligned with a pitch of an exposure wavelength or less, a transmission efficiency is higher than an isolated minute aperture pattern. In a periodic structure having five apertures with a pattern width of 80 nm and a pitch of 200 nm, an about 15-fold quantity of light compared with an isolated minute aperture is transmitted through the mask pattern per one aperture.

Figure 11B:
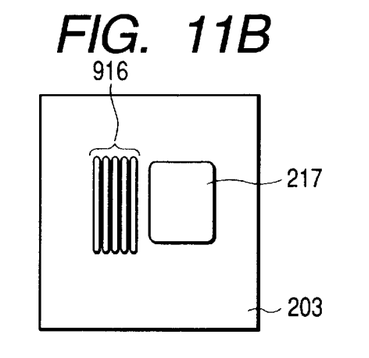

Thus, exposure was conducted in an exposure light quantity such that the periodic fine photoresist pattern 916 was formed by exposure with the periodic minute aperture 913, whereby pattern expansion of the photoresist pattern 217 due to exposure from the aperture 214 could be minimized.

(Example 6)

Figure 12A:
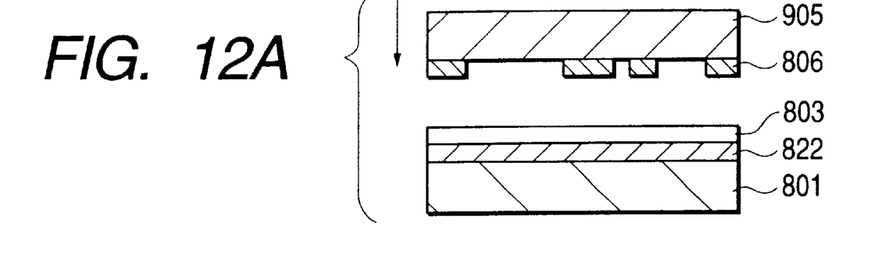
FIGS. 12A, 12B, 12C and 12D are schematic views for showing a method for forming patterns by using a layer absorbing light for exposure as the first layer in Example 6 according to this invention.

In this example, a buffer layer for absorbing light for exposure is formed under the photoresist layer. FIG. 12A shows a photomask and a photoresist used in this example. On one side of a mask substrate 905, a Cr thin film is deposited to a thickness of 80 nm, as a shielding film 806. An original pattern to be transferred is formed into this shielding film by using an EB (Electron Beam) drawing apparatus. Here, on the photomask, there are apertures having various sizes, i.e., an aperture having a size with a width of 80 nm or more where the evanescent light leaks as the main component of transmitted light and an aperture having a size where the propagating light is transmitted.

On an Si substrate 801, a positive type photoresist corresponding to a g-ray is formed to a thickness of 400 nm by using a spin coater. It is then heated at 200° C. for 30 minutes to form the first layer 822. On the first layer 822, an Si-containing positive type photoresist corresponding to KrF is formed to a thickness of 80 nm and it was pre-baked to form the second layer 803.

The Si substrate 801 on which the two-layer photoresist has been formed is moved toward the shielding film 806 on the photomask and finally, the photoresist of the second layer 803 is contacted with the shielding film 806 of the Cr thin film on the photomask.

Figure 12B:
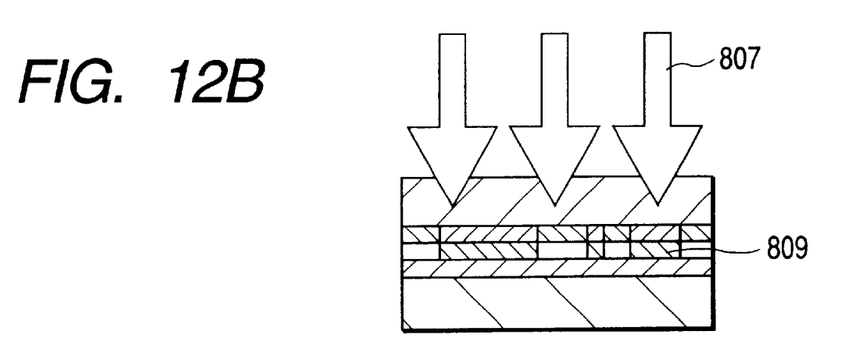

Then, the second layer 803 is exposed by the evanescent light and the propagating light 807 from a KrF light source for exposure to transfer the pattern of the shielding film 806 to the second layer 803 as a photoresist reaction portion 809 (FIG. 12B).

The photoresist as the first layer may absorb light for exposure to prevent reflection and expansion.

Figure 12C:
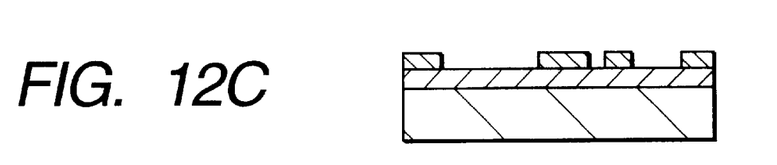

The photomask is removed from the photoresist. Then, the photoresist is developed and post-baked. Thus, the original pattern to be transferred on the photomask is transferred to the second layer 803 (FIG. 12C).

Figure 12D:
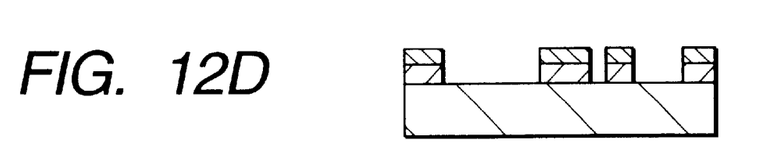

While using the pattern transferred to the second layer as a mask, the first layer is processed with oxygen RIE (FIG. 12D). By using oxygen RIE in processing, Si contained in the second layer is oxidized to improve oxygen-RIE resistivity.

As described above, a light quantity adjusted for the minute aperture could be used to simultaneously form patterns by exposure from the minute aperture and the aperture. Furthermore, the first layer was a layer with a higher absorbance of an exposure wavelength, which could minimize pattern expansion in a direction along the substrate plane by exposure from the aperture.

(Example 7)

Figure 13A:
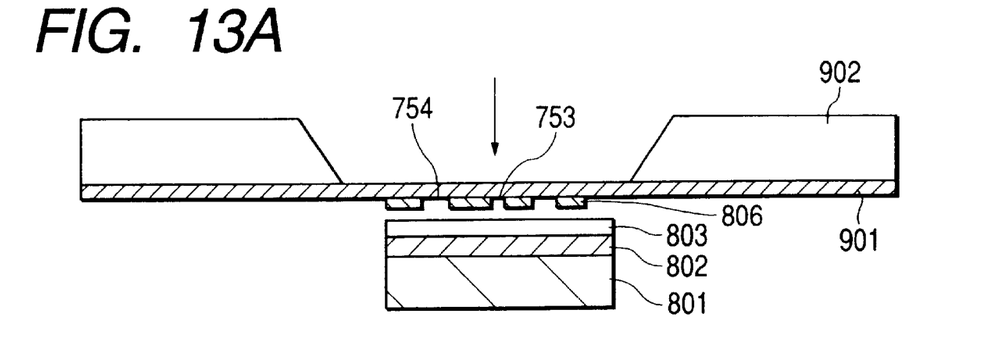
FIGS. 13A, 13B, 13C and 13D are schematic views for showing an exposure state of using an elastic mask in Example 7 according to this invention.

In this example, there will be described an exposure method using an elastic material for a photomask. FIG. 13A shows a photomask and a photoresist used in this example. On an Si substrate as a mask support 902, SiN as a mask material 901 is vapor-deposited to 1 $\mu$m. On this side, a Cr thin film is vapor-deposited to a thickness of 50 nm. To process this Cr thin film by using an FIB (Focused Ion Beam) drawing apparatus, an elastic photomask having a shielding film 806 as a pattern to be transferred is formed. On the photomask, there are apertures having various sizes, i.e., a minute aperture 753 having a size with a width of 80 nm where the evanescent light leaks as the main component of transmitted light and an aperture 754 having a size where the propagating light is transmitted.

On an Si substrate 801 on which a shielding film has been applied, a positive type photoresist is applied to a thickness of 400 nm by using a spin coater. It is then heated at 200° C. for 30 minutes to form the first layer 802. On the first layer 802, an Si-containing positive type photoresist is applied to a thickness of 80 nm and it was pre-baked to form the second layer 803.

Figure 13B:
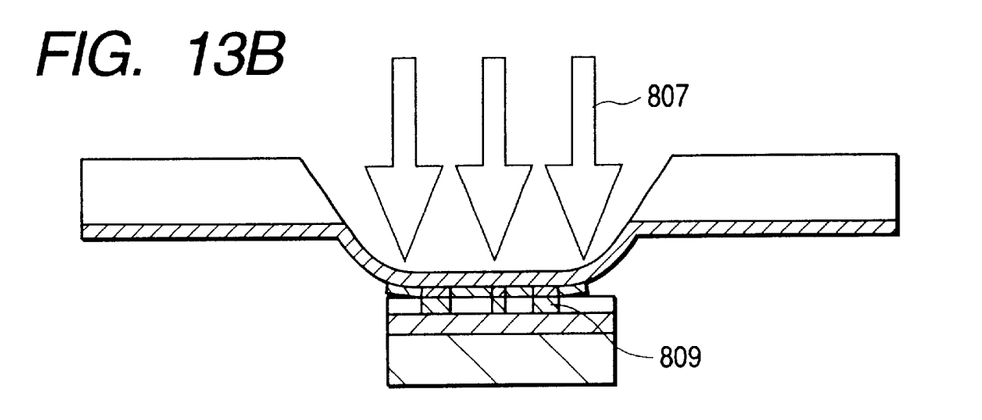

The Si substrate 801 on which the photoresist of a two-layer structure has been applied is moved toward the shielding film 806 on the photomask. Furthermore, the air between the photomask and the second layer photoresist 803 is evacuated with a pump to bend the elastic photomask due to the atmospheric pressure and evenly contact the second layer photoresist 806 with the thin film photomask over a large area (FIG. 13B).

Figure 13C:
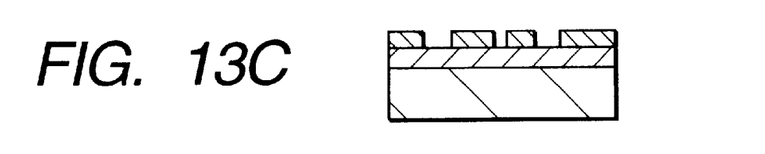
Figure 13D:
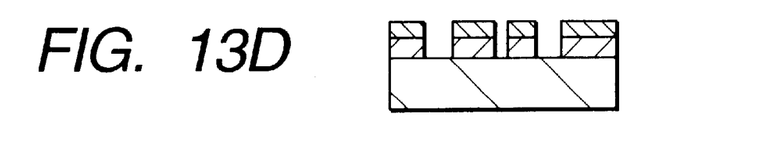

Then, the second layer 803 is exposed by the evanescent light and the propagating light from light for exposure 807 to transfer the pattern of the shielding film 806 to the second layer 803 as a photoresist reaction portion 809 (FIG. 13C). The photomask is removed from the photoresist. Then, the photoresist is developed and post-baked. Thus, the original pattern to be transferred on the photomask is transferred to the second layer 803. While using the pattern transferred to the second layer as a mask, the first layer is processed with oxygen RIE.

Thus, the photoresist is more closely contacted with the photomask by using the thin film photomask. In addition, oxygen RIE may be used in processing to oxidize Si contained in the second layer, thereby leading to improvement in oxygen-RIE resistance.

As described above, according to this invention, a photoresist which is formed with a thickness equal to or smaller than a minute aperture size on a substrate is exposed by using a photomask having a minute aperture pattern where the evanescent light is the main component of light for exposure of the photoresist and an aperture pattern where the propagating light is the main component of light for exposure of the photoresist, so that photoresist patterns with various sizes can be formed on the substrate by a single exposure.

What is claimed is:

1. A method of forming a pattern by using a photomask having both a minute aperture where a main component of transmitted light is evanescent light and an aperture where a main component of transmitted light is propagating light, said method comprising the steps of:

on a suitable substrate to be processed, forming a photoresist film having a thickness of at most equal to a width of the minute aperture;

exposing the photoresist film by incident light for exposure; and adjusting the film thickness and at least one of intensity of the incident light and dose of exposure so as to prevent a photoresist pattern formed by the propagating light from extending to an adjacent pattern made by the evanescent light.

2. The method according to claim 1, wherein the light for exposure enters in a direction substantially perpendicular to the photomask.

3. The method according to claim 1, wherein the thickness of the photoresist is at most 100 nm.

4. The method according to claim 1, further comprising a step of bending the photomask toward the photoresist.

5. The method according to claim 1, further comprising a step of reducing a width of the aperture where the main component of the transmitted light is the propagating light to a value smaller than a designed dimension.

6. The method according to claim 1, further comprising a step of forming a buffer layer between the photoresist and the substrate to be processed.

7. The method according to claim 6, wherein the step of forming a buffer layer comprises a step of forming an organic material film having a dry etching resistant property and a film having a reactive-ion-etching resistant property.

8. The method according to claim 7, wherein a thickness of the organic material film is at least 100 nm.

9. The method according to claim 6, wherein the step of forming a buffer layer includes a step of forming an organic material film having a dry-etching resistant property and the photoresist is made of a material having a reactive-ion-etching resistant property.

10. The method according to claim 6, wherein the buffer layer which is located under the photoresist has a higher absorbance value for the exposure light than that of the photoresist.

11. The method according to claim 1, wherein the minute aperture where a main component of transmitted light is evanescent light is periodically arranged in a plurality at intervals of at most the wavelength of the exposure light.

* * * * *